United States Patent
Ivanov et al.

(10) Patent No.: US 11,252,810 B2
(45) Date of Patent: Feb. 15, 2022

(54) SHORT-WAVELENGTH RADIATION SOURCE WITH MULTISECTIONAL COLLECTOR MODULE AND METHOD OF COLLECTING RADIATION

(71) Applicants: Isteq B.V., Eindhoven (NL); RnD-ISAN, Ltd, Moscow (RU)

(72) Inventors: Vladimir Vitalievich Ivanov, Moscow (RU); Aleksandr Yurievich Vinokhodov, Moscow (RU); Konstantin Nikolaevich Koshelev, Moscow (RU); Mikhail Sergeyevich Krivokorytov, Moscow (RU); Vladimir Mikhailovich Krivtsun, Moscow (RU); Aleksandr Andreevich Lash, Moscow (RU); Vyacheslav Valerievich Medvedev, Moscow (RU); Yury Viktorovich Sidelnikov, Moscow (RU); Oleg Feliksovich Yakushev, Korolyev (RU); Oleg Borisovich Khristoforov, Moscow (RU); Denis Aleksandrovich Glushkov, Nieuwegein (NL); Samir Ellwi, Crawley (GB)

(73) Assignees: Isteq B.V., Eindhoven (NL); RnD-ISAN. Ltd, Moscow (RU)

( * ) Notice: Subject to any disclaimer, the term of this patent is extended or adjusted under 35 U.S.C. 154(b) by 0 days.

(21) Appl. No.: 16/952,587

(22) Filed: Nov. 19, 2020

(65) Prior Publication Data
US 2021/0092824 A1    Mar. 25, 2021

Related U.S. Application Data

(63) Continuation-in-part of application No. 16/773,240, filed on Jan. 27, 2020, now Pat. No. 10,887,973, (Continued)

(30) Foreign Application Priority Data

Nov. 24, 2017  (RU) .......................... RU2017141042
Apr. 26, 2019  (RU) .......................... RU2019113052
(Continued)

(51) Int. Cl.
*H05G 2/00*      (2006.01)
*G03F 7/20*      (2006.01)

(52) U.S. Cl.
CPC ......... *H05G 2/005* (2013.01); *G03F 7/70916* (2013.01); *H05G 2/006* (2013.01); *H05G 2/008* (2013.01); *G03F 7/70033* (2013.01)

(58) Field of Classification Search
CPC ........ H05G 2/005; H05G 2/006; H05G 2/008; G03F 7/70916; G03F 7/70033
See application file for complete search history.

(56) References Cited

U.S. PATENT DOCUMENTS

2008/0157006 A1\* 7/2008 Wilhelmus Van Herpen ............. G03F 7/70916
250/492.2

\* cited by examiner

*Primary Examiner* — Nicole M Ippolito
*Assistant Examiner* — Hanway Chang
(74) *Attorney, Agent, or Firm* — Nadya Reingand; Yan Hankin (57) ABSTRACT

A radiation source contains a collector module comprising an optical collector, positioned in a vacuum chamber with an emitting plasma, further comprising a means for debris mitigation which include at least two casings arranged to output debris-free homocentric beams of the short-wavelength radiation, coming to the optical collector preferably consisting of several identical mirrors. Outside each casing there are permanent magnets that create a magnetic field inside the casings to mitigate charged fraction of debris particles and provide the debris-free homocentric beams of
(Continued)

short-wavelength radiation. Other debris mitigating techniques are additionally used. Preferably the plasma is laser-produced plasma of a liquid metal target supplied by a rotating target assembly to a focus area of a laser beam. The technical result of the invention is the creation of high-powerful high-brightness debris-free sources of short-wavelength radiation with large, preferably more than 0.25 sr, collection solid angle.

19 Claims, 4 Drawing Sheets

Related U.S. Application Data which is a continuation-in-part of application No. 16/535,404, filed on Aug. 8, 2019, now Pat. No. 10,588,210, which is a continuation-in-part of application No. 16/103,243, filed on Aug. 14, 2018, now Pat. No. 10,638,588.

(30) Foreign Application Priority Data

SHORT-WAVELENGTH RADIATION SOURCE WITH MULTISECTIONAL COLLECTOR MODULE AND METHOD OF COLLECTING RADIATION

CROSS-REFERENCE TO RELATED APPLICATIONS

This patent application is a Continuation-in-part of U.S. patent application Ser. No. 16/773,240 filed Jan. 27, 2020, which in turn is a Continuation-in-part of U.S. patent application Ser. No. 16/535,404, filed on Aug. 8, 2019, which in turn is a Continuation-in-part of U.S. patent application Ser. No. 16/103,243, filed on Aug. 14, 2018, with priority to Russian patent application RU2017141042 filed Nov. 24, 2017, the present application also claims priority to Russian patent application RU2020129329 filed Sep. 4, 2020, all of which are incorporated herein by reference in their entireties.

FIELD OF INVENTION

The invention relates to high-brightness radiation sources designed to generate soft X-ray, extreme ultraviolet (EUV) and vacuum ultraviolet (VUV) radiation at wavelengths of approximately 0.4 to 200 nm and method of collecting radiation, which provide highly effective debris mitigation in large collection angle to ensure the long-term operation of the high-power light source and its integrated equipment.

BACKGROUND OF INVENTION

Sources of radiation of soft X-ray, extreme ultraviolet (EUV) and vacuum ultraviolet (VUV) ranges of high intensity are used in many fields: for microscopy, biomedical and medical diagnostics, material testing, analysis of nanostructures, in atomic physics, and lithography.

A plasma effectively emitting in the soft X-ray range (0.4-10 nm), EUV (10-20 nm) and VUV (20-120 nm) ranges can be obtained both by focusing the radiation of high-power lasers on the target and in the discharge.

From international patent application PCT/EP2013/061941, published under number WO 2014/001071 on Aug. 22, 2013 a laser-produced plasma (LPP) EUV light source with collector module comprising: a collector for collecting radiation generated by a radiation generating plasma, and for directing the generated radiation; further comprising a means for suppression of infrared laser radiation in the beam of plasma radiation is known.

LPP EUV light source is characterized by a high brightness. However, there is a problem of protecting the optical collector from debris to ensure a long lifetime of the LPP EUV light source.

The debris, generated as a by-product of the plasma during the radiation source operation, can be in the form of high-energy ions, neutral atoms or vapors and clusters of the plasma fuel material. Debris particles degrade the collector optics, which can consist of one or several collector mirrors located near the radiation source. In addition to the fact that microdroplets and particles deposited on the collector mirror reduce its reflection coefficient, high-velocity particles can damage the collector mirror and, possibly, other parts of the optical system located behind the collector mirror. This makes it urgent to develop debris-free high-brightness sources of short-wavelength radiation.

From the international patent application PCT/RU2012/000701, published under number WO/2013/122505 on Aug. 22, 2013, a laser-triggered discharge plasma EUV light source is known. The focused laser beam is directed to one of the electrodes so that the laser-triggered discharge has an asymmetric, predominantly curved, banana-like shape. The intrinsic magnetic field of such discharge has a gradient that determines the predominant motion of the discharge plasma to the region of a weaker magnetic field. The direction of plasma flow is significantly different from the direction to the optical collector. To obtain a high radiation power, the discharge is produced at a high pulse repetition rate. The invention provides a simple and highly effective mitigation of the charged particles.

However, suppression of the neutral particles and clusters requires the use of more sophisticated debris mitigation techniques.

The light generation in the soft X-ray, EUV and VUV ranges is most effective with the use of laser-produced plasma. The development LPP radiation sources in recent years has been largely stimulated by the development of projection extreme ultraviolet lithography for high-volume manufacturing of integrated circuits (ICs) with 7-nm node and below.

A debris mitigation technique based on the use of auxiliary plasma generated along the path of a short wavelength radiation beam in a specially injected gas is disclosed in U.S. Pat. No. 9,268,031 published on Feb. 23, 2016. Debris that acquire an electric charge as a result of exposure to the auxiliary plasma are then deflected by a pulsed electric field. The method is effective for protection optical collector against ion/vapor fraction of debris, for example, in sources using xenon as plasma fuel.

However, in sources using metals as plasma forming material, the main threat to the elements of the optical collector is the micro-droplet fraction of debris particles, against which this method is powerless.

From U.S. Pat. No. 8,519,366, published on Aug. 27, 2013, a debris mitigation method in LPP EUV radiation source using Sn droplet targets is known. The method involves using a magnetic mitigation of charged fraction of debris particles. Along with this, the debris technique includes a foil traps and ports for supplying the protective flows of buffer gas, which provides a sufficiently effective trapping of neutral atoms and clusters of the liquid metal target material.

However, additional, rather complex means are required for mitigating micro-droplet fraction of debris particles.

The method for debris mitigating, known from U.S. Pat. No. 7,302,043, published on Nov. 27, 2007, is partially devoid of this drawback. It provides for the use of a fast-rotating shutter capable of transmitting short wavelength radiation through at least one opening during one rotation period and preventing the passage of debris during another rotation period of the shutter.

However, the use of such means for debris mitigation in a compact radiation source is technically too difficult to implement.

This drawback is largely devoid of shortwave radiation sources known from U.S. Pat. No. 10,638,588, published on Apr. 28, 2020, U.S. Pat. No. 10,588,210, published on Mar. 10, 2020, and US patent application 20200163197, published on May 5, 2020, which are incorporated into this description by reference in their entirety. The sources disclosed in these patent documents contain a vacuum chamber with a rotating target assembly delivering a target in the form of a molten metal layer to the interaction zone with a focused laser beam. The complex of means for debris mitigation includes the rotation of the target with a high linear velocity, more than 80 m/s. To suppress the ion/vapor fraction of debris, the use of foil traps, magnetic fields and directional flows of protective buffer gas is provided. In embodiments of the radiation source, a replaceable membrane of carbon nanotubes (CNT membrane) is installed in the path of the short-wavelength radiation beam. Also the debris shield, surrounding region of the emitting plasma, is fixedly installed providing entering the laser beam into the region of the pulsed emitting plasma and exiting a short-wavelength radiation beam from it. It is also proposed to use a laser prepulse to suppress the ionic fraction of debris. Another proposed debris mitigation mechanism is to use a high repetition rate of laser pulses, for example, on the order of 1 MHz, in order to ensure the evaporation of microdroplets up to 0.1 μm in size resulting from the previous laser pulse by radiation and plasma of the subsequent pulse.

These methods have a sufficiently high efficiency of debris mitigation, however, they are intended for relatively small spatial angles of collection of short-wavelength plasma radiation, as a result, the average power in the short-wavelength radiation beam turns out to be insufficient for a number of applications.

SUMMARY

Accordingly, there is a need to eliminate at least some of the drawbacks mentioned above. In particular, there is a need for improved light sources that are compact, high-powerful with large collecting angle and provide substantially complete debris mitigation in the path of the output beam of short-wavelength radiation.

This invention is aimed at solving a technical problem associated with a multiple increase in the average power of pure high-brightness sources of soft X-ray, EUV and VUV radiation while ensuring their commercial availability and economic operation.

The technical result of the invention is the creation of high-powerful high-brightness sources of short-wavelength radiation with highly effective debris mitigation in a beam of short-wavelength radiation propagating in a large, preferably more than 0.25 sr, solid angle.

Achievement of the purpose is possible by means of a plasma short-wavelength radiation source with a collector module comprising an optical collector, positioned in a vacuum chamber with plasma emitting a short-wavelength radiation, further comprising a means for debris mitigation on a path of the short-wavelength radiation to the optical collector.

The source is characterized the means for debris mitigation includes at least two casings arranged to output debris-free homocentric beams of the short-wavelength radiation coming to the optical collector, and outside each casing there are permanent magnets that create a magnetic field inside the casings, and a magnetic field formed by the permanent magnets removes charged fraction of debris particles from the homocentric beams to provide the debris-free homocentric beams.

Preferably, an outer surface of each casing contains two first faces extended substantially parallel to a direction of short-wavelength radiation propagation from the plasma and parallel to a vertical or to another chosen direction.

Preferably, each casing includes two second faces extended substantially parallel to the direction of short-wavelength radiation propagation from the plasma and substantially perpendicular to the two first faces of the casing.

The embodiment of invention an area of first faces of each casing is greater than an area of the rest of the casing surface, and the permanent magnets are substantially in contact with the first faces of each casing.

The embodiment of invention an area of the first faces of each casing is less than an area of the rest of the surface of the casing, and the permanent magnets are located on the surface of the casings outside their first faces.

The embodiment of invention an angle between the two first faces of each casing is less than 30 degrees.

The embodiment of invention an angle between adjacent faces of the two adjacent casings is from 3 to 10 degrees.

In the embodiment of invention the permanent magnets, located on a most distant from each other parts of the most distant from each other casings, are connected by a magnetic core.

In the embodiment of invention the optical collector contains several mirrors installed in the path of each of the debris-free homocentric beams of the short-wavelength radiation.

Preferably, a reflecting surface of all mirrors form a spheroid, in one focus of which is the plasma and in another focus is a focal point of all mirrors of an optical collector.

Preferably, the means for debris mitigation include membranes based on carbon nanotubes (CNT) installed between each casing and the optical collector in paths of the beams of short-wavelength radiation.

In the embodiment of invention the means for debris mitigation include protective gas flows, directed inside each casing into the plasma, while each CNT membrane simultaneously serves as a casing window for an exit of the debris-free homocentric beam of the short-wavelength radiation and a gas shutter preventing an exit of the protective gas through it.

In the embodiment of invention the permanent magnets are located along an entire length of the casings.

Preferably, the means for debris mitigation include foil plates placed in each of the casings and oriented in radial directions with respect to the plasma, substantially perpendicular to magnetic field lines.

In the embodiment of invention, the plasma can be selected from a group consisting of: laser-produced plasma, z-pinch plasma, plasma focus, discharge-produced plasma, laser-initiated discharge-produced plasma.

Preferably, the plasma is laser-produced plasma of a liquid metal target supplied by a rotating target assembly to a focus area of a laser beam.

Preferably, the target is a molten metal layer, formed by centrifugal force on a facing to an axis of rotation surface of an annular groove, implemented in the rotating target assembly.

In another aspect, the invention relates to method of collecting radiation comprising: collecting by an optical collector radiation emitted by plasma at a plasma formation location, and directing at least a portion of the radiation to a focal point, wherein the emitted by plasma radiation is guided through at least two casings equipped by means for debris mitigating and arranged to form debris-free homocentric beams of the short-wave radiation coming out of casings to the optical collector.

Preferably, outside each casing there are permanent magnets that create a magnetic field inside the casings, and a magnetic field formed by the permanent magnets mitigates charged fraction of debris particles and other debris mitigation techniques, including protective gas flow, foil trap, CNT membrane are also used in each casing to provide the debris-free homocentric beams.

Preferably, the optical collector contains several mirrors installed in the path of each of the debris-free homocentric beams and a reflecting surfaces of all mirrors lie on the surface of the ellipsoid or modified ellipsoid, in one focus of which is the plasma, and in another focus is a focal point of all mirrors of an optical collector.

The above-mentioned and other objectives, advantages and features of this invention will be made more evident in the following non-limiting description of its embodiments, provided as an example with reference to attached drawings.

BRIEF DESCRIPTION OF THE DRAWINGS

The essence of the invention is illustrated by drawings, in which.

These drawings do not cover and, moreover, do not limit the entire scope of the options for implementing this technical solution, but represent only illustrative material of a particular case of its implementation.

DETAILED DESCRIPTION OF THE PREFERRED EMBODIMENTS

Figure 1:
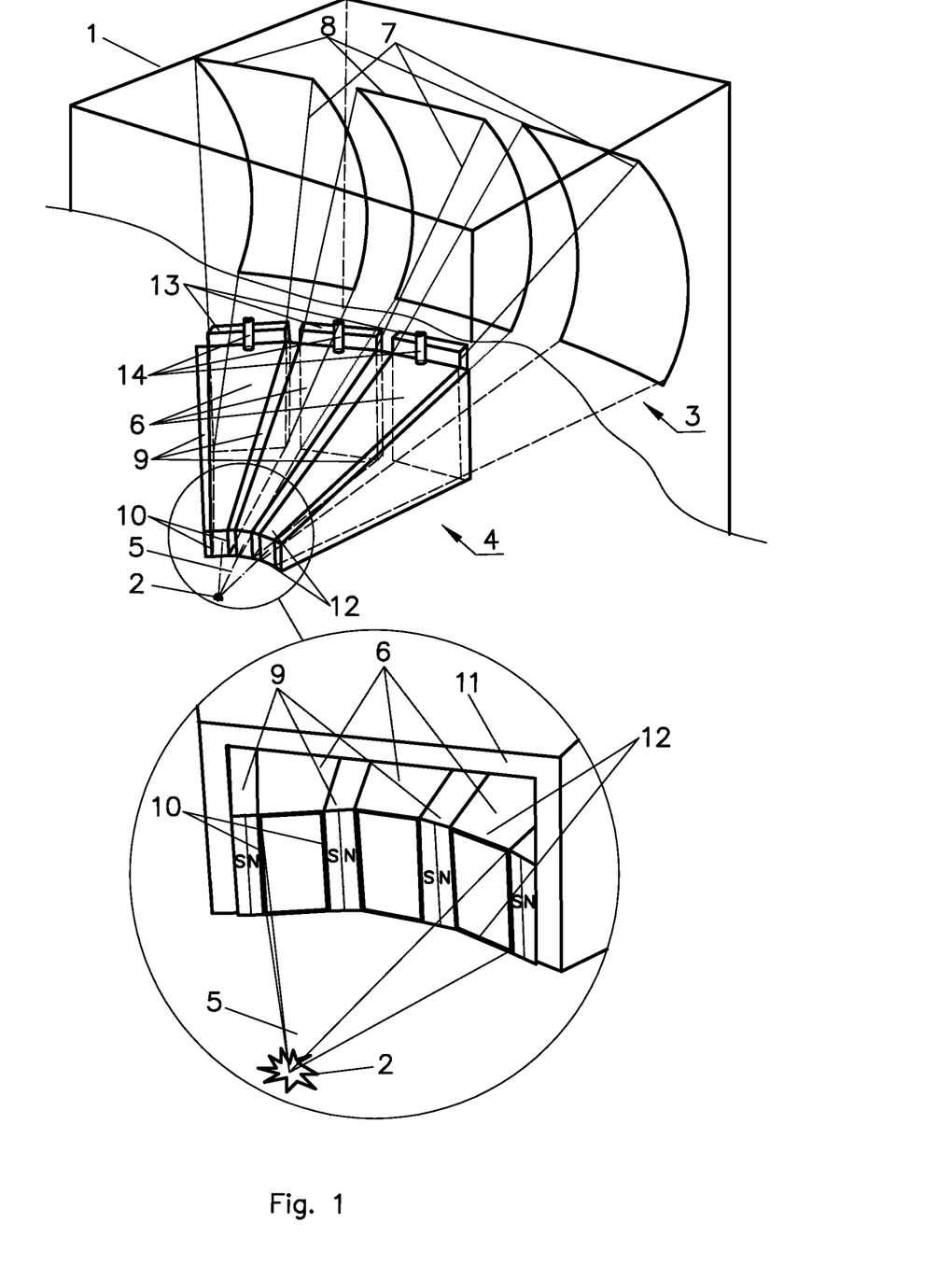
FIG. 1, FIG. 2—schematic diagrams of a short-wavelength radiation source with multisectional collector module in accordance with the present invention, FIG. 3, FIG. 4—schematic diagrams of a laser-produced plasma radiation source with a rotating target assembly.

According to an example of invention embodiment illustrated at various scales in FIG. 1, a plasma radiation source comprises a vacuum chamber 1 with a region of pulsed high-temperature plasma 2 emitting short-wavelength radiation. As a by-product, the debris particles, which include vapors, ions and clusters of the plasma-forming material, are generated in plasma region. The plasma radiation source further comprises a collector module consisting of an optical collector 3 and of means 4 for debris mitigation placed on the path of the short-wavelength radiation beam 5 directed from plasma 2 to the optical collector 3. Optical collector redirects the short-wavelength radiation to an intermediate focus and then to the optical system operating with short-wavelength radiation.

In accordance with the invention, the means 4 for debris mitigation includes at least two casings 6 arranged to output debris-free homocentric beams 7 of the short-wavelength radiation coming to the optical collector 3, preferably consisting of several mirrors 8. Characteristic plasma size is of about 0.1 mm (measured as the FWHM of the free electron density or the FWHM of the brightness profile of the light emitting plasma region) therefore, the plasma radiation source can be considered quasi-point, and radiation beams, coming out from it, homocentric.

Outside each casing 6 there are permanent magnets 9 that create a magnetic field inside the casings 6, and a magnetic field formed by the permanent magnets 9 removes charged fraction of debris particles from the homocentric beams 7 to provide the debris-free homocentric beams.

The outer surface of each casing 6 contains two first faces 10 extended substantially parallel to a direction of short-wavelength radiation propagation from the plasma 2 and parallel to a vertical or to another chosen direction.

Outside each casing 6 are permanent magnets 9, which create a magnetic field inside the casings 6, the magnetic induction vectors of which are directed substantially perpendicular to the optical axis of the casings.

Preferably, the permanent magnets 9 are located along an entire length of the casings 6.

In contrast to the known solutions, the means 4 for debris mitigation in accordance with the present invention are a multi-section system that allows to significantly increase the solid angle of collection of short-wavelength plasma radiation, while maintaining the high effective debris mitigation. An increase in the collection solid angle makes it possible to significantly (several times) increase the collected power of short-wavelength radiation and thereby increase the efficiency of using of such type radiation sources in almost all areas of applications.

In single-section systems, a simple increase in the transverse dimensions of the housing leads to a sharp decrease in the effectiveness of the magnetic protection against charged particles. This is due to the fact that the larger the size of the casing along the lines of force of the magnetic field, the lower the values of the magnetic induction in the volume of the casing, which leads to a decrease in the transverse velocity of charged particles propagating through the casing from the region of the plasma emitting the short-wavelength 3 to the collector mirror 8. Thus, during the flight of the section, the particles cannot deflect a sufficient distance to avoid hitting the mirror. Experiments have shown that for the effective operation of the magnetic protection, it is necessary that the values of the magnetic induction in the center of the casing at a distance of about 40 mm from the region of the plasma emitting the short-wavelength were not less than 0.5 T. It has also been experimentally established that the flat angle between the sides of the casing, on which the magnets are located, should not exceed 30 degrees.

Thus, the use of a multisection debris mitigation system, in which the plane angle between the faces of the casing does not exceed 30 degrees, makes it possible to create in each casing a constant magnetic field of sufficient magnitude for high effective magnetic mitigation of charged particles.

In accordance with preferred embodiment of the invention, the permanent magnets 9, located on a most distant from each other first faces 10 of the most distant from each other casings 6, are connected by a magnetic core 11. The magnetic core 11, preferably made of magnetically soft steel, makes it possible to reduce the loss of the magnetic field because of scattering by concentrating it in the magnetic core, and thereby increase it in the volume of each casing, increasing the efficiency of magnetic debris mitigation.

In an embodiment of the invention, each casing 6 includes two second faces 12 extended substantially parallel to the direction of short-wavelength radiation propagation from the plasma 2 and substantially perpendicular to the two first faces 10 of the casing.

The orientation of the first and second faces 10, 12 in the radial directions with respect to the plasma 2 provides high geometric transparency of the multisectional debris mitigation system. The same purpose is served by the fact that in embodiments of the invention the angle between adjacent faces of the two adjacent casings 6 is in the range from 3 to 10 degrees.

In preferred embodiments of the invention, area of first faces 10 of each casing 6 is greater than an area of the rest of the casing 6 surface, and the permanent magnets 9 are substantially in contact with the first faces 10 of each casing 6.

In another embodiment (not shown) the area of the first faces 10 of each casing 6 can be less than an area of the rest of the surface of the casing, and the permanent magnets 9 can be located on the surface of the casings 6 outside their first faces 10, for example, on large second faces 12 of each casing 6.

The means 4 for debris mitigation preferably include membranes 13 from carbon nano tubes installed between each casing 6 and the mirror 8 of the optical collector 3 in the paths of the homocentric beams 7. The CNT—membranes preferably have a thickness in the range of 20 to 100 nm, which ensures their high strength and high transparency in the range of wavelengths shorter than 20 nm. So CNT membranes 13 provide the exit of the homocentric beams 7 due to their high transparency in the wavelength range shorter than 20 nm. At the same time, the CNT membranes 13 prevent the passage of debris particles through them, providing debris-free homocentric beams 7 of short-wavelength radiation.

Along with this, the means for debris mitigation include protective gas flows, directed inside each casing 6 into the plasma, while each CNT membrane 13 simultaneously serves as a casing window for an exit of the debris-free homocentric beam 7 of the short-wavelength radiation and a gas shutter preventing an exit of the protective gas through it.

Providing an average vacuum in the casings at a protective gas pressure of about 20 Pa allows to increase the number of collisions between gas molecules and debris particles scattered from the plasma region and, thereby deflecting them from rectilinear motion. At the same time, the use of a CNT membrane as a gas seal allows the use of increased pressure only within the casings, and not along the entire path of propagation of homocentric beams 7 to the consumer optics. This reduces the loss of short-wavelength radiation due to absorption in the gas.

To obtain radiation in the wavelength range of more than 20 nm, CNT membranes 13 are not used, since their transparency in the indicated range sharply decreases with increasing radiation wavelength.

Figure 2:
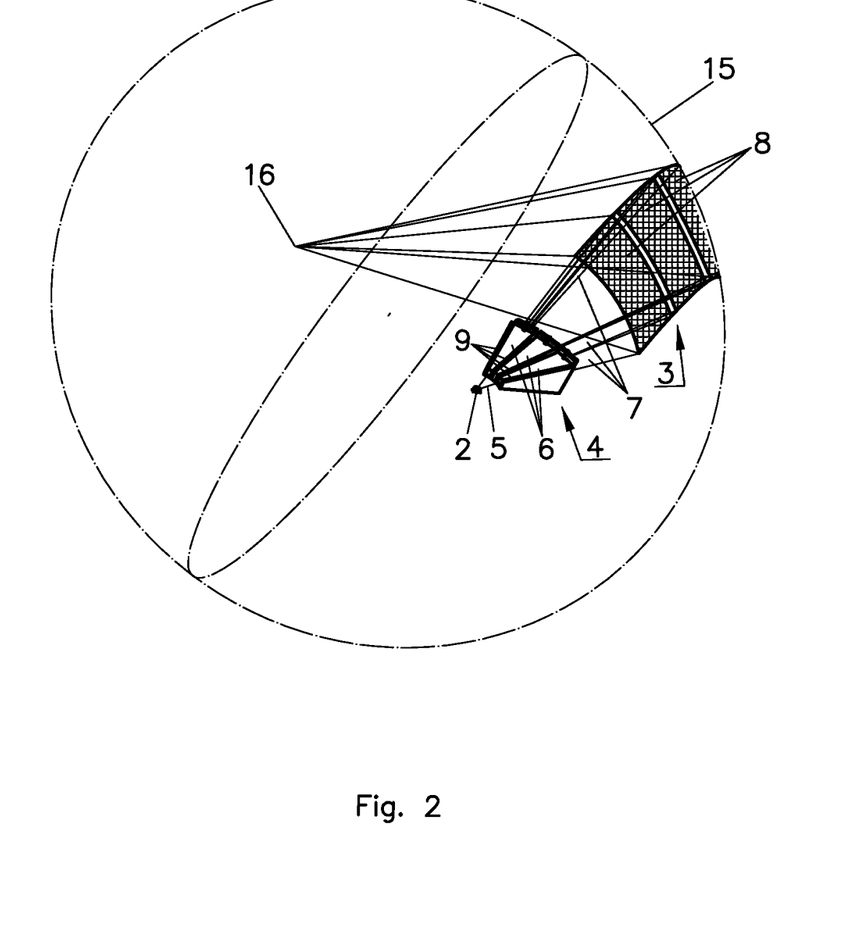

In the preferred embodiment shown in FIG. 2, the optical collector 3 contains several mirrors 8, while the reflecting surface of all mirrors belongs to the ellipsoid of revolution or in other words spheroid 15, in one focus of which is the region of pulsed emitting plasma 2, and in the other—the focus point 16 of the mirrors 8 of the optical collector 3. The production of such mirrors is very expensive, since the roughness of the collector mirror substrates is only 0.2-0.3 nm, and the cost of such mirrors, especially with an aspherical profile, grows with an increase in their size according to a law 2-3 times stronger than an increase in area. So, the use of several identical mirrors 8 significantly reduces the cost of the optical collector.

The pulsed emitting plasma can be selected from the group consisting of: laser-produced plasma, z-pinch plasma, plasma focus, discharge-produced plasma, laser-triggered discharge plasma.

In a preferred embodiment, the pulsed high temperature plasma is the laser plasma of a liquid metal target material delivered by a rotating target assembly to the focusing region of the laser beam, as detailed in Patent Application 20200163197 published on May 21, 2020 which is incorporated herein by reference in its entireties.

Figure 3:
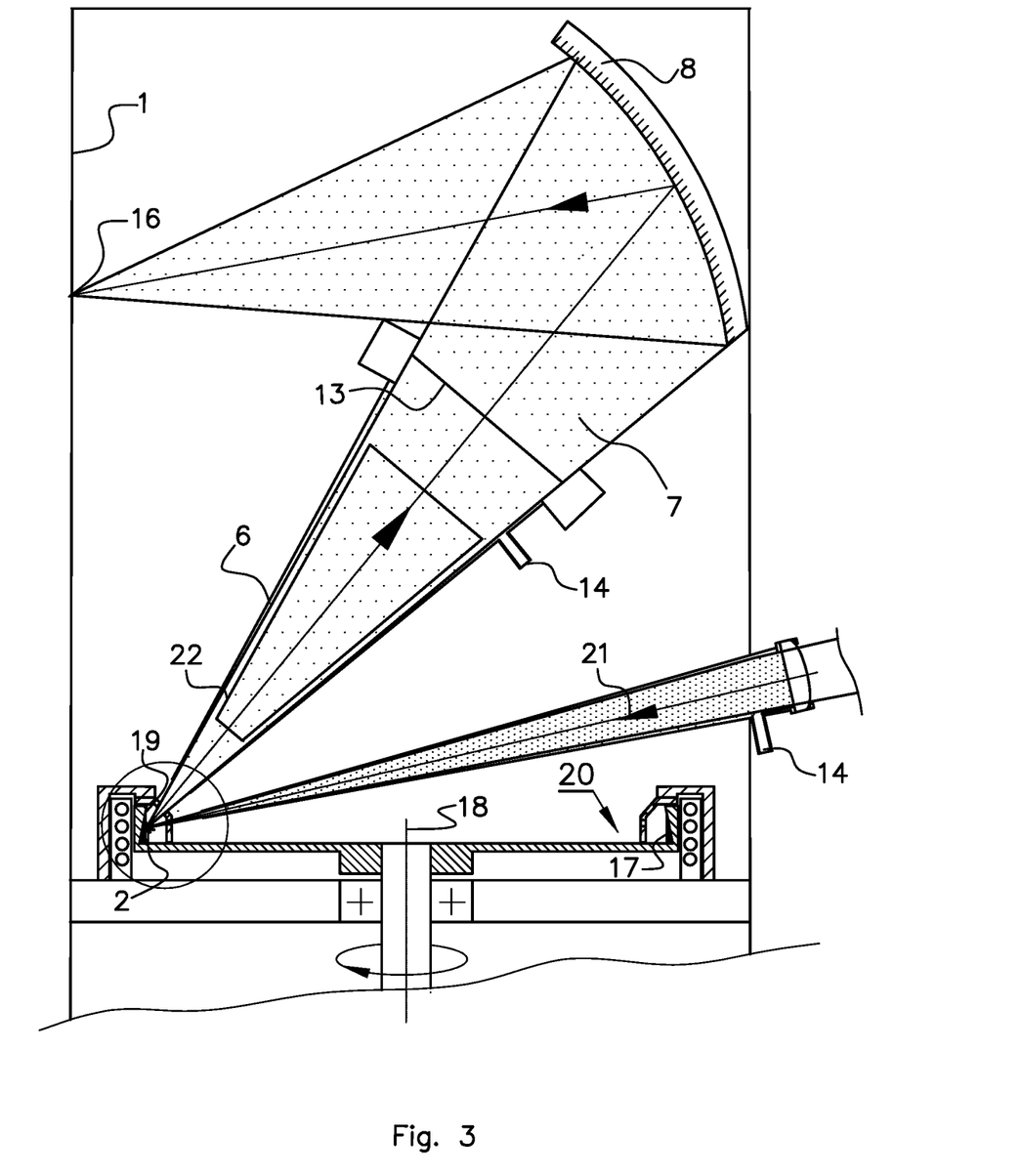

In accordance with the preferred embodiment of the invention shown schematically in FIG. 3, the target 17 is a molten metal layer formed by centrifugal force on the surface of the annular groove 19 of the rotating target assembly 20 facing the axis of rotation 18. An isometric view of a preferred embodiment of the invention is shown schematically in FIG. 4.

Figure 4:
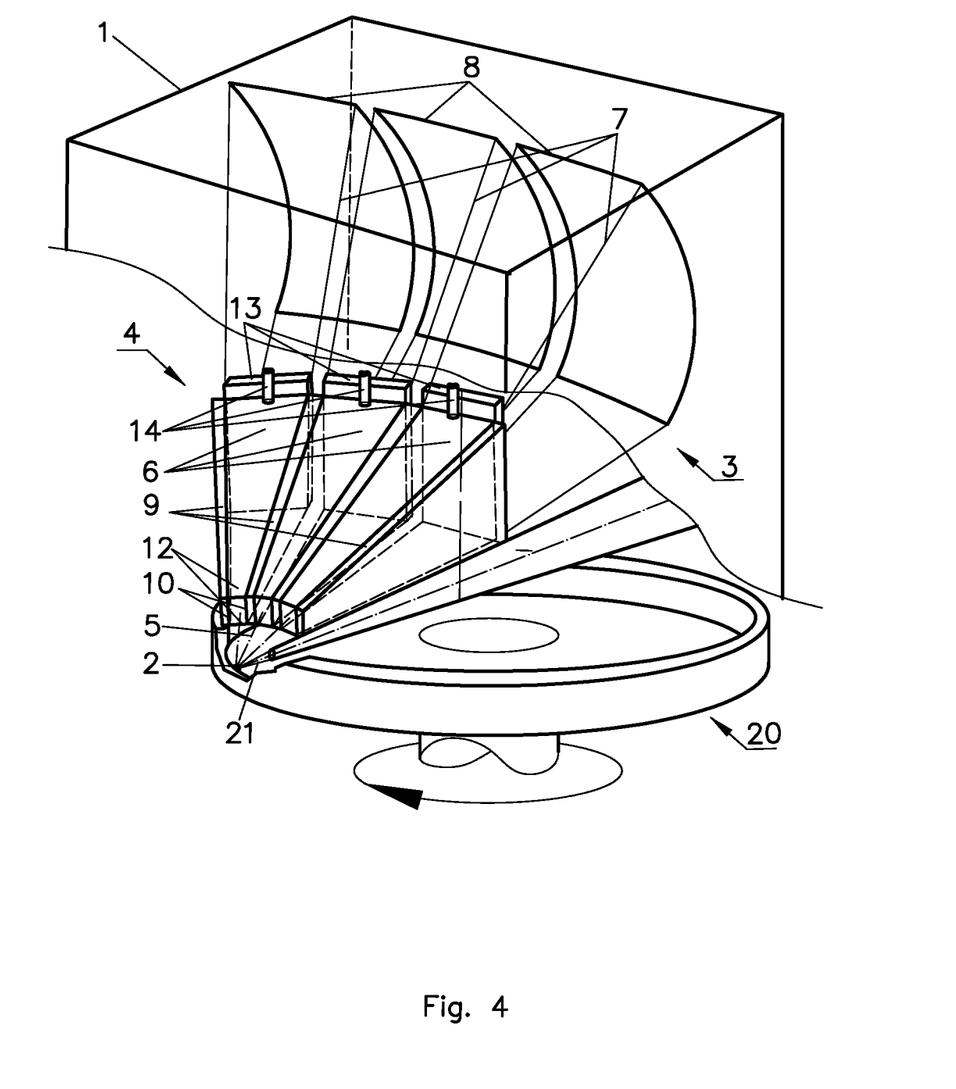

The operation of the high brightness short-wavelength radiation source in the preferred embodiment using the laser-produced plasma of the liquid metal target illustrated in FIG. 3 and FIG. 4 is carried out as follows. Vacuum chamber 1 is pumped out by an oil-free pumping system to a pressure below $10^{-5} \ldots 10^{-8}$ mbar, removing gaseous components such as nitrogen, oxygen, carbon, etc., capable of interacting with the liquid metal target material.

Target 17, the material of which belongs to the group of non-toxic low-melting metals, including Sn, Li, In, Ga, Pb, Bi, Zn and their alloys, is delivered by a rotating target assembly into the interaction zone with a focused laser beam 21. The target is exposed to a focused pulsed laser beam 21 with a high pulse repetition rate in the range from 1 kHz to 1 MHz. Depending on the target material and the laser power density on the target, short-wavelength radiation of the laser plasma is generated in the soft X-ray and/or EUV and/or VUV spectral ranges.

The beam 5 of short-wave radiation emitted by the plasma 2, passing through the casings 6 and preferably through the CNT membranes 13, is converted into debris-free homocentric beams directed to the mirrors 8 of the optical collector 3. Herewith permanent magnets 9, FIG. 4, create a constant magnetic field, preferably directed perpendicular to the axis of the homocentric beams. Under the action of the Lorentz force, charged fractions of debris particles (mainly ions) deviate from rectilinear motion along the axes of the homocentric beams 7, colliding either with the inner walls of the casings 6 or with plates 22 specially placed in the casings, FIG. 3, are trapped by them. Plates 22 mounted in casings 6 are directed radially to the plasma 2 and preferably perpendicular to the lines of magnetic field created by magnets 9. Plates 22 allow more efficient capture of high-speed charged particles, because the higher the speed of the particles, the smaller the transverse distance they deflect under the influence of the magnetic field. Along with this protective gas flows prevent the movement of the ion/vapor fraction of debris particles, depositing them on the walls of the casings 6 and plates 22, protecting the CNT membranes 13 from debris. Due to their high transparency in the wavelength range shorter than 20 nm, CNT membranes provide the exit of a short-wavelength beam to the mirrors 8 of the optical collector 3. At the same time, CNT membranes 13 prevent the passage of debris through them, providing reliable protection for each mirror 8. Additionally, effective debris mitigation in the casings 6 is ensured by organizing directed flows of protective gas supplied through the gas inlets 14. Shielding gas streams protect CNT membranes 13 from ion/vapor fraction of debris, increasing their service life.

Similar means for debris mitigation are also used along the path of the laser beam 21.

Above-described devices realize particular embodiments of the present invention relating in one of its aspects to a method of collecting radiation. The method comprises collecting by an optical collector 3 short-wavelength radiation emitted by plasma 2 at a plasma formation location, and directing at least a portion of the radiation to a focal point 16, FIG. 2. The emitted by plasma 2 radiation beam 5 is guided through at least two casings 6 integrated with means 4 for debris mitigating 4 and arranged to form debris-free homocentric beams 7 of the short-wave radiation coming out of casings 6 to the optical collector 3.

Outside each casing permanent magnets 9 creating a magnetic field inside the casings 6 are used for mitigation charged fraction of debris particles and other debris mitigation techniques, including protective gas flow, foil trap, CNT membrane are also used in each casing to provide the debris-free homocentric beams 7.

The optical collector 3 preferably contains several mirrors 8 installed in the path of each of the debris-free homocentric beams 7 and a reflecting surfaces of all mirrors lie on the surface of the ellipsoid 15 or modified ellipsoid, in one focus of which is the plasma 2, and in another focus 16 is a focal point of all mirrors 8 of an optical collector 3. The modified ellipsoid shape may be used for providing improved intensity uniformity of collected radiation in the far field compared with a perfect ellipsoid shape.

Thus, the present invention makes it possible to create debris-free, powerful, high-brightness sources of soft X-ray, EUV and VUV radiation with a long lifetime and ease of use.

INDUSTRIAL APPLICABILITY

The proposed devices are intended for a number of applications, including microscopy, materials science, X-ray diagnostics of materials, biomedical and medical diagnostics, inspection of nano- and microstructures, including actinic mask defect inspection for EUV lithography.

What is claimed is:

1. A plasma short-wavelength radiation source with a collector module, comprising:
   an optical collector (3), positioned in a vacuum chamber (1) with a plasma (2) emitting a short-wavelength radiation, further comprising a means (4) for debris mitigation on a path of the short-wavelength radiation to the optical collector (3), wherein
   the means (4) for debris mitigation include at least two casings (6) arranged to output debris-free homocentric beams (7) of the short-wavelength radiation coming to the optical collector (3),
   and outside each casing (6) there are permanent magnets (9) that create a magnetic field inside the casings (6), and a magnetic field formed by the permanent magnets (9) removes charged fraction of debris particles from the homocentric beams (7) to provide the debris-free homocentric beams.

2. The source according to claim 1, wherein an outer surface of each casing contains two first faces (10) extended substantially parallel to a direction of short-wavelength radiation propagation from the plasma (2) and optionally the two first faces are parallel to a vertical.

3. The source according to claim 2, wherein an area of first faces (10) of each casing (6) is greater than an area of the rest of the casing (6) surface, and the permanent magnets (9) are substantially in contact with the first faces (10) of each casing (6).

4. The source according to claim 2, wherein an area of the first faces (10) of each casing (6) is less than an area of the rest of the surface of the casing (6), and the permanent magnets (9) are located on the surface of the casings (6) outside their first faces (10).

5. The source according to claim 2, wherein an angle between the two first faces (10) of each casing (6) is less than 30 degrees.

6. The source according to claim 2, wherein an angle between adjacent faces of the two adjacent casings (6) is from 3 to 10 degrees.

7. The source according to claim 1, wherein the permanent magnets (9), located on a most distant from each other parts of the most distant from each other casings (6), are connected by a magnetic core (11).

8. The source according to claim 1, wherein the optical collector (3) contains several mirrors (8) installed in the path of each of the debris-free homocentric beams (7).

9. The source according to claim 8, wherein a reflecting surface of all mirrors (8) form an spheroid (15), in one focus of which is the plasma (2), and in another focus (16) is a focal point of all mirrors of an optical collector.

10. The source according to claim 1, wherein the means (4) for debris mitigation include membranes (13) based on carbon nanotubes (CNT) installed between each casing (6) and the optical collector (3).

11. The source according to claim 10, wherein the means (4) for debris mitigation include protective gas flows, directed inside each casing (6) into the plasma, while each CNT membrane (13) simultaneously serves as a casing window for an exit of the debris-free homocentric beam (7) of the short-wavelength radiation and a gas shutter preventing an exit of the protective gas through it.

12. The source according to claim 1, wherein the permanent magnets (9) are located along an entire length of the casings.

13. The source according to claim 1, wherein the means (4) for debris mitigation include foil plates (22) placed in each of the casings (6) and oriented in radial directions with respect to the plasma (2), substantially perpendicular to magnetic field lines.

14. The source according to claim 1, wherein the plasma can be selected from a group consisting of: laser-produced plasma, z-pinch plasma, plasma focus, discharge produced plasma, laser-triggered discharge plasma.

15. The source according to claim 1, wherein the plasma is a laser-produced plasma of a liquid metal target (17) supplied by a rotating target assembly (20) to a focus area of a laser beam (21).

16. The source according to claim 15, wherein the target (17) is a molten metal layer, formed by centrifugal force on a facing to an axis of rotation (18) surface of an annular groove (19), implemented in the rotating target assembly (20).

17. A method of collecting radiation, comprising: collecting by an optical collector a radiation emitted by plasma at a plasma formation location, and directing at least a portion of the emitted by plasma radiation to a focal point, wherein
   the emitted by plasma radiation is guided through at least two casings equipped by means for debris mitigating and arranged to form debris-free homocentric beams of the short-wave radiation coming out of casings to the optical collector,
   wherein, outside each casing, permanent magnets creating a magnetic field inside the casings are used for mitigation of a charged fraction of debris particles.

18. The method according to claim 17, further including protective gas flow, foil trap, and CNT membrane debris mitigation elements.

19. The method according to claim 17, wherein the optical collector contains several mirrors installed in a path of each of the debris-free homocentric beams and reflecting surfaces of all mirrors lie on a surface of an ellipsoid or a modified ellipsoid, in one focus of which is the plasma.

* * * * *